United States Patent
Yu

(10) Patent No.: US 6,434,206 B1
(45) Date of Patent: Aug. 13, 2002

(54) PHASE LOCKED LOOP CIRCUIT FOR REDUCING LOCK-IN TIME

(75) Inventor: Byung-Hyun Yu, Kyunggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 09/391,142

(22) Filed: Sep. 7, 1999

(30) Foreign Application Priority Data

Sep. 4, 1998 (KR) ............................................. 98-36595

(51) Int. Cl.[7] ................................................. H03D 3/24
(52) U.S. Cl. ........................... 375/376; 327/157; 331/17
(58) Field of Search .......................... 375/376; 331/1 A, 331/14, 25, 17; 327/1 R, 156, 157

(56) References Cited

U.S. PATENT DOCUMENTS

| | | | |
|---|---|---|---|
| 4,562,411 A | * 12/1985 | O'Pourke et al. ............. 331/1 A |
| 4,736,167 A | * 4/1988 | Kojima et al. ................. 331/17 |
| 5,696,468 A | * 12/1997 | Nise ............................. 331/14 |
| 5,781,048 A | * 7/1998 | Nakao et al. ................. 327/157 |
| 6,031,429 A | * 2/2000 | Shen ............................. 331/17 |

* cited by examiner

*Primary Examiner*—Don N. Vo
(74) *Attorney, Agent, or Firm*—F. Chau & Associates, LLP.

(57) ABSTRACT

A PLL circuit includes a phase detector for detecting a phase error between an input and output signal of the PLL circuit and outputting a pump up and a pump down signal. A charge pump generates a charge pump signal in response to the pump up and pump down signals. A loop filter filters the charge pump signal to generate a filtered signal. A boost-up device coupled to a loop filter output terminal charges a loop filter input terminal, to expedite the filtered signal reaching a predetermined common mode voltage level. A VCO coupled to the loop filter output terminal and the phase detector generates the output signal. A common mode voltage reaching time in the lock-in time is reduced by the boost-up device charging the loop filter to expedite the filtered signal reaching the common mode voltage, when the filtered signal is lower than a predetermined detecting voltage.

17 Claims, 5 Drawing Sheets

PHASE LOCKED LOOP CIRCUIT FOR REDUCING LOCK-IN TIME

FIELD OF THE INVENTION

The present invention relates to phase lock loops and, more particularly, to a phase locked loop circuit for reducing lock-in time.

BACKGROUND OF THE INVENTION

Phase locked loops (PLLs) are found in a myriad of electronic applications such as communication receivers and clock synchronization circuits for computer systems. FIG. 1 is a schematic block diagram illustrating a conventional differential PLL circuit. The PLL circuit includes a phase detector 10, a charge pump 20, a loop filter 30, and a voltage controlled oscillator (VCO) 40.

The phase detector 10 monitors the phase difference between an input signal IN to the PLL circuit and an output signal OUT from the PLL circuit, the output signal OUT being fed back from the voltage controlled oscillator (VCO) 40. The phase detector 10 also generates up control signals up and $\overline{\text{up}}$, and down control signals dn and $\overline{\text{dn}}$ for input to the charge pump circuit 20. The charge pump 20 can be implemented as a current pump or a voltage pump. The charge pump 20 charges and discharges the loop filter 30 with a pair of charge pump signals VOP and VON.

The charge pump signals VOP and VON are subsequently filtered by the loop filter 30, which is typically constructed as a low pass filter. The loop filter 30 also assists in removing or reducing high frequency components and clock jitter. Signals VOP' and VON' are output from the loop filter 30 to the VCO 40. The variable oscillator 40 can be implemented as a voltage controlled oscillator(VCO) or a current controlled oscillator. The VCO 40 oscillates in response to the filtered signals VOP' and VON'. The output oscillation of the VCO 40 is the output signal OUT. When the PLL circuit is phase locked, the output signal OUT will be locked at the desired output frequency.

In general, practical limits of the output frequency range are often defined by dynamic loop characteristics underlying the PLL circuit. The loop characteristics include loop variables such as loop bandwidth, natural frequency, damping factor, among others. Values of the loop characteristics are typically based upon present parameters of component parts for the PLL circuit. The present parameters typically prevent frequency synthesis outside a predefined range of the PLL.

It is common for the PLL to lose phase lock when the input signal IN fades or jumps to a radically different frequency of operation. The out-of lock state can be detected with a lock detection circuit (not shown) and the system processing suspended until the PLL circuit can re-achieve phase lock. The transition time from the unlocked state to the locked state is referred to as the lock-in time or pull-in time. The lock-in time consists of a common mode voltage reaching time of the filtered signals VOP' and VON', and a tracking time of the phase detector 10. The common mode voltage reaching time occupies the major part of the lock-in time.

Thus, to reduce the common mode voltage reaching time, the current from the charge pump 20 is increased, or a time constant (i.e., $\tau=RC$) of the loop filter 30 is decreased. The time constant $\tau$ may be reduced by adjusting the resistor R or the capacitor C of the loop filter 30, so that they charge more quickly. However, the loop bandwidth increases in proportion to the reduction of the time constant. In that case, the high frequency components are not filtered sufficiently by the loop filter 30 in proportion to the increase in loop bandwidth. Furthermore, the loop characteristics of the PLL circuit vary with respect to the designed loop characteristics. Therefore, the PLL circuit cannot operate stably.

As described above, it is difficult to shorten the lock-in time because of the need to maintain the loop characteristics of the PLL circuit for stable operation thereof.

SUMMARY OF THE INVENTION

It is therefore an object of the present invention to provide a phase locked loop circuit for reducing a lock-in time.

It is another object of the invention to provide a differential phase locked loop circuit for reducing the lock-in time.

According to an aspect of the present invention, there is provided a phase locked loop (PLL) circuit for generating an output signal in response to an input signal. The PLL circuit includes a phase detector for detecting a phase error between the input signal and the output signal and outputting a pump up signal and a pump down signal based on the phase error. A charge pump coupled to the phase detector generates a charge pump signal in response to the pump up and the pump down signals. A loop filter coupled to the charge pump filters out high-frequency components from the charge pump signal to generate a filtered signal. The loop filter has an input terminal and an output terminal. A boost-up device coupled to the output terminal of the loop filter charges the input terminal of the loop filter in response to the filtered signal, to expedite the filtered signal reaching a predetermined common mode voltage level. A voltage-controlled oscillator coupled to the output terminal of the loop filter and the phase detector generates the output signal in response to the filtered signal.

According to another aspect of the present invention, there is provided a differential phase locked loop (DPLL) circuit for generating an output signal in response to an input signal. The DPLL includes a phase detector for detecting a phase error between the input signal and the output signal, and outputting a pair of pump up signals and a pair of pump down signals based on the phase error. A charge pump coupled to the phase detector generates a pair of charge pump signals in response to the pump up and the pump down signals. A loop filter coupled to the charge pump filters out high frequency components from the charge pump signals to generate a first and a second filtered signal. The loop filter has two input terminals and two output terminals. A boost-up device coupled to the output terminals of the loop filter charge the input terminals of the loop filter in response to the first and the second filtered signals, to expedite the first and the second filtered signals reaching a predetermined common mode voltage level. A voltage-controlled oscillator coupled to the output terminals of the loop filter and the phase detector generates the output signal in response to the first and the second filtered signals.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF PREFERRED EMBODIMENTS

Figure 1:
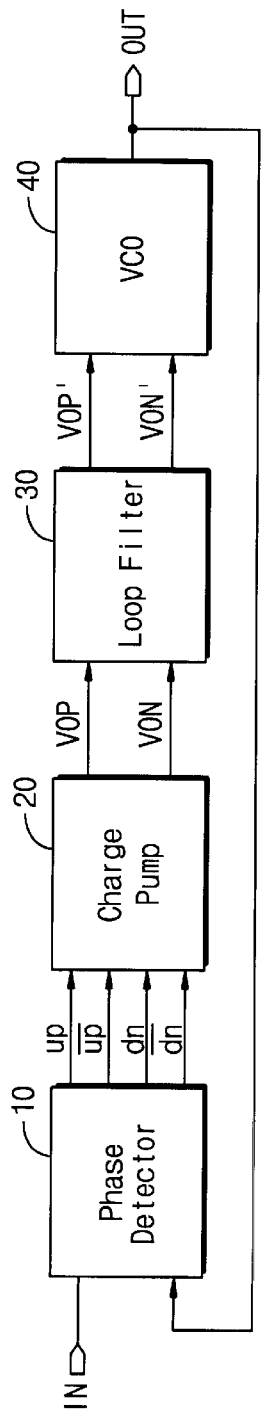
FIG. 1 is a schematic block diagram illustrating a conventional differential phase locked loop (DPLL) circuit.
Figure 2:
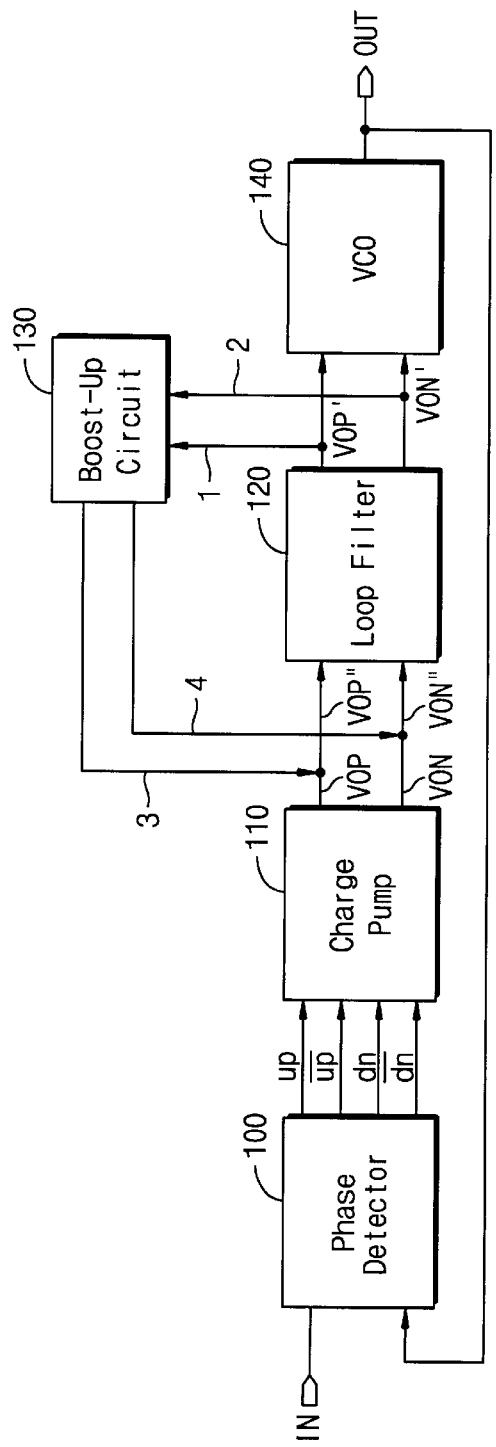
FIG. 2 is a schematic block diagram illustrating a DPLL circuit according to an embodiment of the present invention.

FIG. 2 is a schematic block diagram illustrating a differential phase locked loop (DPLL) circuit having a boost-up circuit, according to one embodiment of the present invention. The PLL circuit comprises a phase detector 100, a charge pump 110, a loop filter 120, a boost-up circuit 130, and a voltage-controlled oscillator 140. The PLL circuit generates an output signal OUT in response to an input signal IN. Generally, the output signal OUT is divided by a frequency divider (not shown) which is programmed to produce a division ratio of N.

The phase detector 100 compares the reference input IN with a divided output signal in order to produce a pair of up control signals up and $\overline{up}$, and a pair of down control signals dn and $\overline{dn}$. The up and down control signals are related to the amount of time measured when the input signal IN leads the divided output signal, or to the amount of time measured when the input signal IN lags the divided output signal.

The up and down control signals up, $\overline{up}$, dn, and $\overline{dn}$ are supplied to the charge pump 110 which, in turn, generates a pair of charge pump signals VOP and VON. The charge pump signals VOP and VON are filtered by the loop filter 120. The loop filter 120 supplies the filtered signals VOP' and VON' to the boost-up circuit 130 via a first line 1 and a second line 2, respectively.

The boost-up circuit 130 detects whether the filtered signals VOP' and VON' are lower than a predetermined detecting voltage Vdet. If the filtered signals VOP' and VON' are lower than the predetermined detecting voltage Vdet, then the boost-up circuit 130 charges the loop filter 120 through a third line 3 and a fourth line 4, before generating the stable output signal OUT from the VCO 140. Thus, the loop filter 140 can receive a pair of charged signals VOP" and VON" by the charging operation of the boost-up circuit 130. Accordingly, the filtered signals of the charged signals VOP" and VON" can reach a predetermined common mode voltage as soon as possible, so that the VCO 140 generates a stable output signal OUT without varying of the designed loop characteristics of the PLL circuit.

On the other hand, when the detected signals VOP' and VON' are higher than the detecting voltage Vdet, the boost-up circuit 130 does not charge the loop filter 120, just as if the boost-up circuit 130 had not been included in the PLL circuit. Thus, the boost-up circuit 130 does not change the designed loop characteristics of the PLL circuit.

Figure 3:
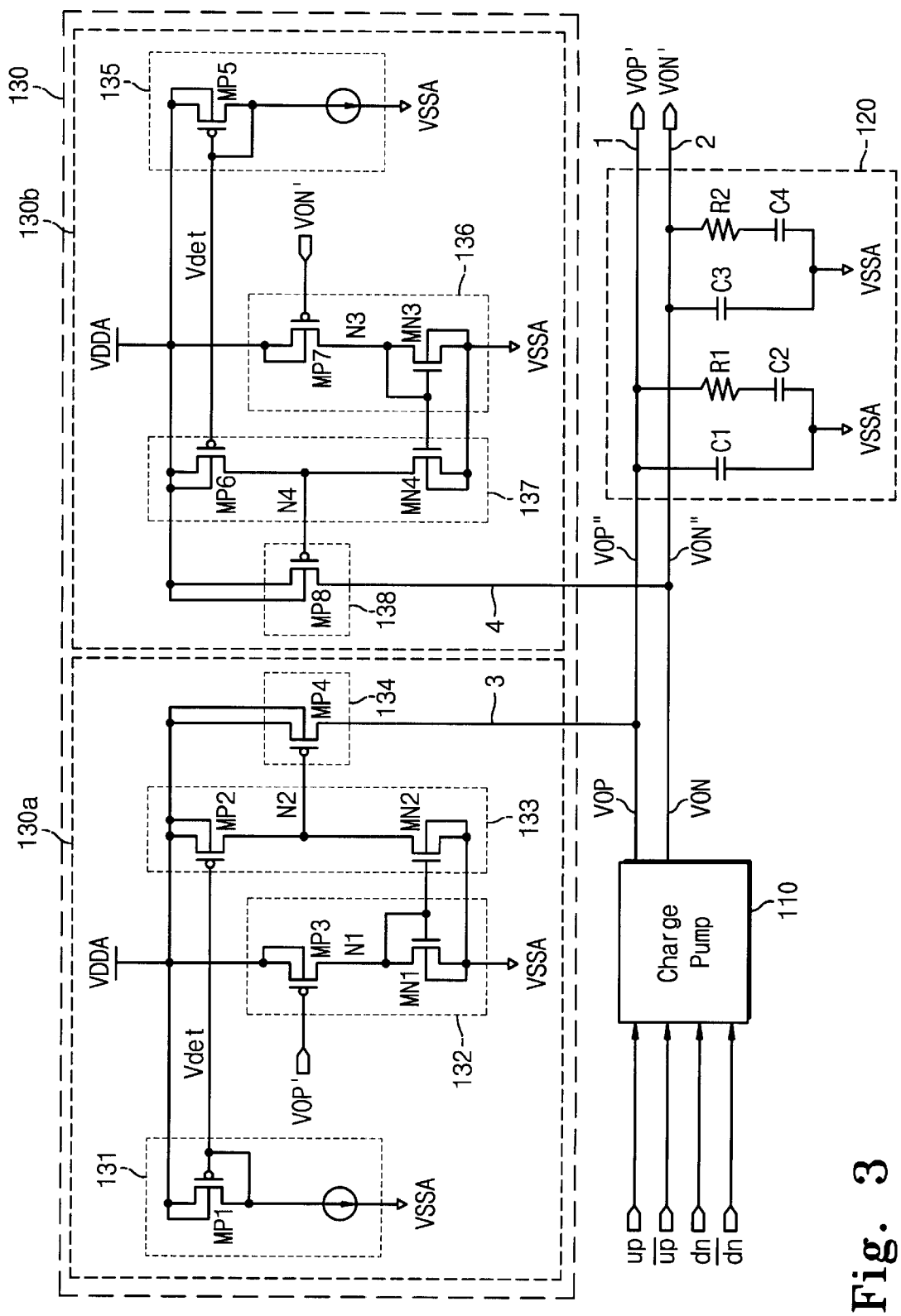
FIG. 3 is a detailed diagram illustrating a boost-up circuit, a charge pump, and a loop filter of FIG. 2.

FIG. 3 is a detailed diagram illustrating the boost-up circuit 130, the charge pump 110, and the loop filter 120 of FIG. 2. The boost-up circuit 130 comprises a first boost-up unit 130a and a second boost-up unit 130b. The first boost-up unit 130a includes a first bias circuit 131, a first input circuit 132, a first detecting circuit 133, and a first charging circuit 134. The second boost-up unit 130b includes a second bias circuit 135, a second input circuit 136, a second detecting circuit 137, and a second charging circuit 138.

The first bias circuit 131 biases the detecting voltage Vdet, and includes a PMOS transistor MP1 having a source coupled to a power supply voltage source VDDA, and a drain coupled to a gate.

The first bias circuit 131 also includes a current sinker coupled between the drain of MP1 and a ground voltage source VSSA.

The first input circuit 132 includes a PMOS transistor MP3 and an NMOS transistor MN1. The PMOS transistor MP3 has a current path formed between the power supply voltage source VDDA and a first node N1. The gate of the PMOS transistor MP3 is coupled to the first line 1 to input the filtered signal VOP'. The NMOS transistor MN1 has a current path formed between the first node N1 and the ground voltage source VSSA. The gate of the NMOS transistor MN1 is coupled to the drain of the PMOS transistor MP3.

The first detecting circuit 133 includes a PMOS transistor MP2 which forms a first current mirror with the PMOS transistor MP1 of the first bias circuit 131. The first detecting circuit 133 also includes an NMOS transistor MN2 which forms a second current mirror with the NMOS transistor MN1 of the first input circuit 132. The PMOS transistor MP2 has a current path formed between the power supply voltage source VDDA and a second node N2. The gate of the PMOS transistor MP2 is coupled to the gate of the PMOS transistor MP1. The NMOS transistor MN2 has a current path formed between the second node N2 and the ground voltage source VSSA. The gate of the NMOS transistor MN2 is coupled to the gate of the NMOS transistor The first charging circuit 134 includes a PMOS transistor MP4 which has a current path formed between the power supply voltage source VDDA and the third line 3. The gate of the PMOS transistor MP4 is coupled to the second node N2.

The second bias circuit 135 also biases the detecting voltage Vdet, and includes a PMOS transistor MP5 having a source coupled to a power supply voltage source VDDA, and a drain coupled to a gate. The second bias circuit 135 also includes a current sinker coupled between the drain of MP5 and the ground voltage source VSSA.

The second input circuit 136 includes a PMOS transistor MP7 and an NMOS transistor MN3. The PMOS transistor MP7 has a current path formed between the power supply voltage source VDDA and a third node N3. The gate of the PMOS transistor MP7 is coupled to the second line 2 to input the filtered signal VON'. The NMOS transistor MN3 has a current path formed between the third node N3 and the ground voltage source VSSA. The gate of the NMOS transistor MN3 is coupled to the drain of the PMOS transistor MP7.

The second detecting circuit 137 includes a PMOS transistor MP6 which forms a third current mirror with the PMOS transistor MP5 of the second bias circuit 135. The second detecting circuit 137 also includes an NMOS transistor MN4 which forms a fourth current mirror with the NMOS transistor MN3 of the second input circuit 136. The PMOS transistor MP6 has a current path formed between the power supply voltage source VDDA and a fourth node N4. The gate of the PMOS transistor MP6 is coupled to the gate of the PMOS transistor MP5. The NMOS transistor MN4 has a current path formed between the fourth node N4 and the ground voltage source VSSA. The gate of the NMOS transistor MN4 is coupled to the gate of the NMOS transistor MN3.

The second charging circuit 138 includes a PMOS transistor MP8 which has a current path formed between the power supply voltage source VDDA and the fourth line 4. The gate of the PMOS transistor MP8 is coupled to the forth node N4.

The first input circuit 132 receives the filtered signal VOP' through the first line 1. The first detecting circuit 133 detects whether a voltage level of the filtered signal VOP' is less than the detecting voltage Vdet biased by the first bias circuit 131. The first charging circuit 134 charges the loop filter 120 through the third line 3 in response to the detected result (i.e., the voltage level of the second node N2). Thus, the loop filter 120 can receive the charged signal VOP", so that the filtered and charged VOP" can reach the common mode voltage rapidly without changing the designed loop characteristics.

The second input circuit 136 receives the filtered signal VON' through the second line 2. The second detecting circuit 137 detects whether a voltage level of the filtered signal VON' is less than the detecting voltage Vdet biased by the second bias circuit 135. The second charging circuit 138 charges the loop filter 120 through the fourth line 4 in response to the detected result (i.e., the voltage level of the fourth node N4). Thus, the loop filter 120 can receive the charged signal VON", so that the filtered and charged signal VON" can also reach the common mode voltage rapidly without the change of the designed loop characteristics.

FIGS. 4A to 4D are graphs illustrating an input and outputs of the boost-up circuit 130 of FIG. 3. Referring to FIG. 3 and FIGS. 4A–4D, the detailed operation of the boost-up circuit 130 will now be given. Note that due to the symmetry of the first boost-up unit 130a and the second boost-up unit 130b, the elements of the first boost-up unit 130a are primarily described, with the elements of the second boost-up unit 130b specified in parenthesis following the elements of the first boost-up unit 130a.

Figure 4A:
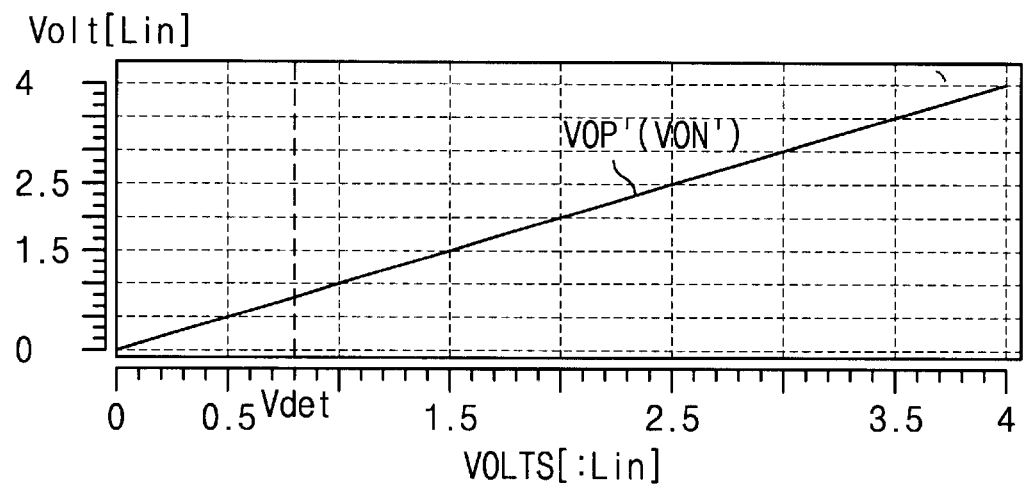
FIGS. 4A to 4D are graphs illustrating an input and outputs of the boost-up circuit of FIG. 3.

FIG. 4A is a graph illustrating the filtered signal VOP' (or VON') of the loop filter 120, which is generated in response to the gradually increasing charge pump signal VOP (or VON). Referring to FIG. 4A, the filtered signal VOP' (or VON') is gradually increased, because of a charging characteristic of the capacitor C included in the loop filter 120. The filtered signal VOP' (or VON') is input to the first input circuit 132 (or the second input circuit 136) of the boost-up unit 130a (or the boost-up unit 130b) through the first line 1 (or the second line 2). If the filtered signal VOP' (or VON') is less than the detecting voltage Vdet, the PMOS transistor MP3 (or PMOS transistor MP7) of the first input circuit 132 (or the second input 136) is turned on, so as to charge node N1 (or node N3).

Figure 4B:
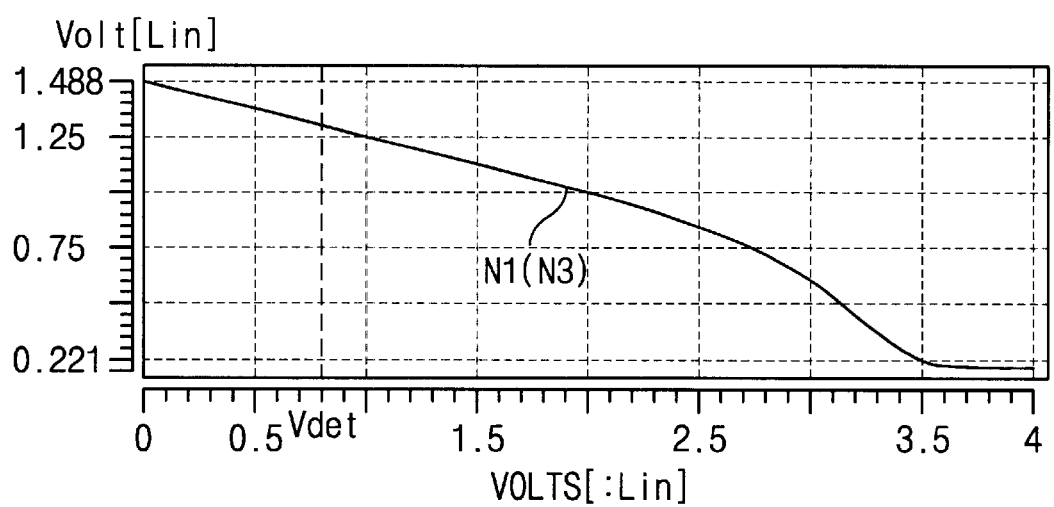

FIG. 4B is a graph illustrating a voltage variation of node N1 (or node N3) included in the first input circuit 132 (or the second input circuit 136). Referring to FIG. 4B, since node N1 (or node N3) is charged to high voltage level by the PMOS transistor MP3 (or the PMOS transistor MP7), the NMOS transistor MN1 (or the NMOS transistor MN3) of the first input circuit 132 (or the second input circuit 136) and the NMOS transistor MN2 (or the NMOS transistor MN4) of the first detecting circuit 133 (or the second detecting circuit 137) are turned on, respectively. The transistors MN1 and MN2 (or MN3 and MN4) discharge node N1 and node N2 (or node N3 and node N4) with the same current. Thus, the voltage levels of node N1 (or node N3) and node N2 (or node N4) are decreased to a low level.

Figure 4C:
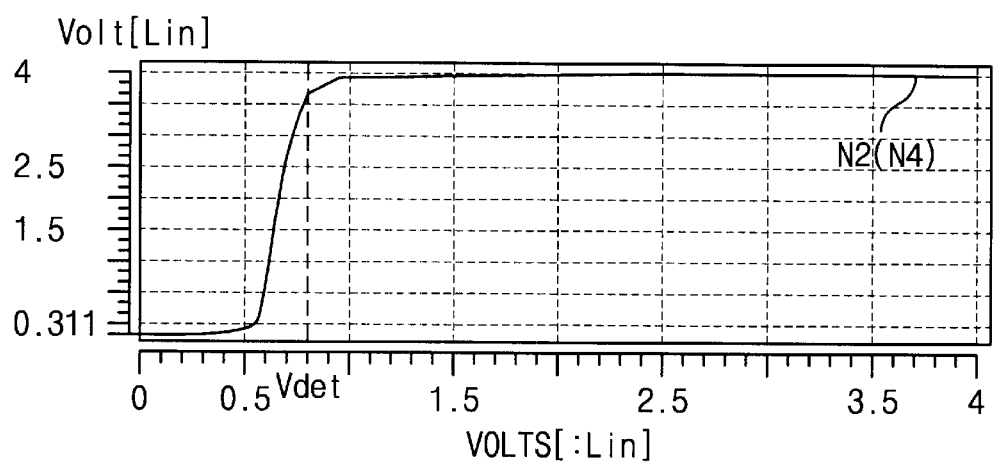

FIG. 4C is a graph illustrating a voltage variation of node N2 (or node N4) included in the first detecting circuit 133 (or the second detecting circuit 137). Referring to FIG. 4C, due to the low voltage level of node N2 (or node N4), the PMOS transistor MP4 (or the PMOS transistor MP8) of the first charging circuit 134 (or the second charging circuit 138) is turned on to charge the loop filter 120 through the third line 3 (or the fourth line 4).

Figure 4D:
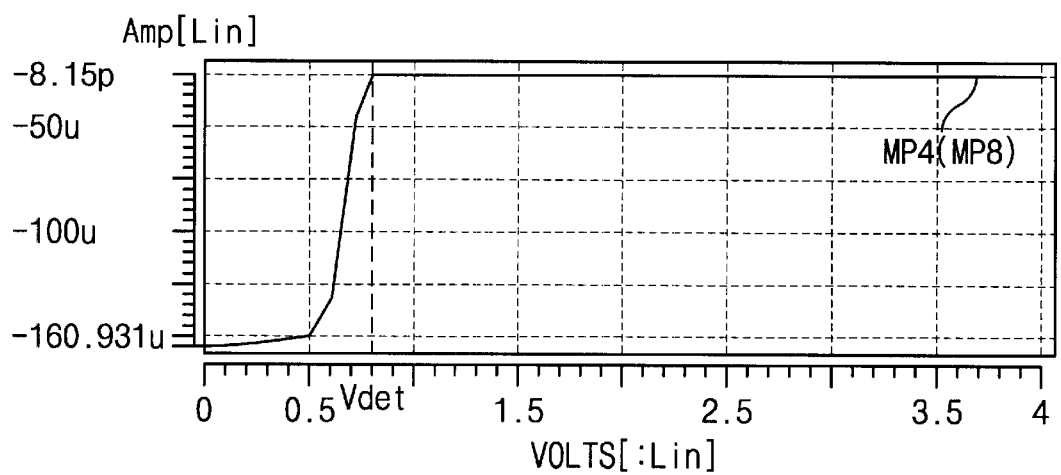

FIG. 4D is a graph illustrating a current for charging the loop filter 120 via the third line 3 (or the fourth line 4). As shown in FIG. 4D, the PMOS transistor MP4 (or MP8) supplies a lot of current to the loop filter 120, when the filtered voltage VOP' (or VON') is lower than the detecting voltage Vdet. Thus, the filtered signal of the loop filter 120 can reach the common mode voltage, rapidly.

Otherwise, as shown in FIGS. 4C and 4D, when the filtered voltage VOP' (or VON') is higher than the detecting voltage Vdet, the voltage level of node N2 (or node N4) is also high. Thus, the PMOS transistor MP4 (or the PMOS transistor MP8) is turned off to end charging of the loop filter 120.

Figure 5:
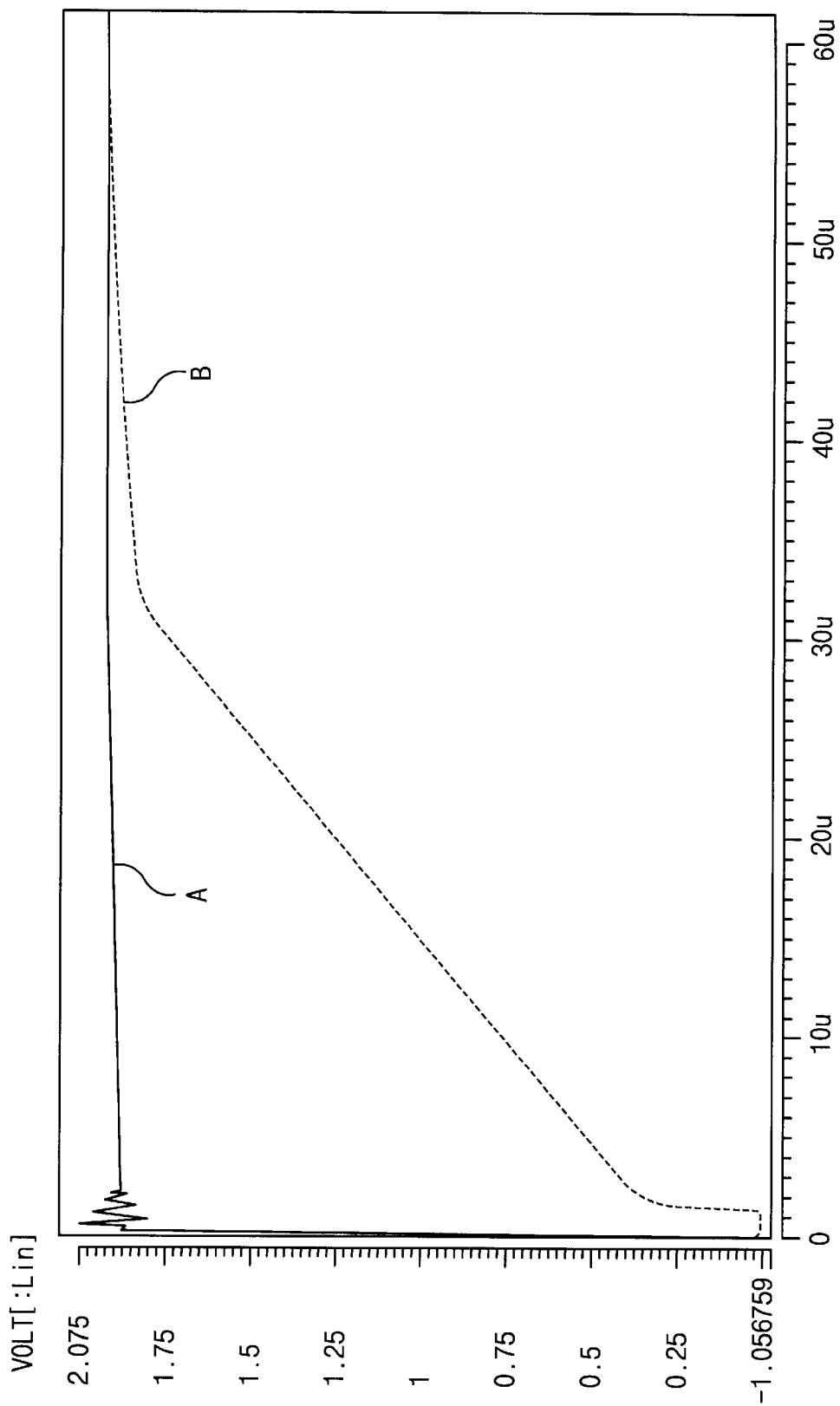
FIG. 5 is a graph illustrating an output of the loop filter according to an embodiment of the present invention, and an output of the conventional loop filter.

FIG. 5 is a graph illustrating an output of the loop filter according to an embodiment of the present invention, and an output of a conventional loop filter. Referring to FIG. 5, the output signal A according to the embodiment of the present invention reaches the common mode voltage more rapidly than the output signal B according to the prior art. It takes about 60 μsec for the output signal B to reach the common mode voltage. Otherwise, it take about 30 μsec for the output signal A to reach the common mode voltage. The output signal A increases with a rapid ascent at the first stage. Thus, the common mode voltage reaching time according to the present invention can be reduced by 50% with respect to the conventional common mode reaching time.

As described above, the boost-up circuit 130 detects whether the filtered signals VOP' and VON' are lower than the predetermined detecting voltage Vdet. If the filtered signals VOP' and VON' are lower than the detecting voltage Vdet, then the boost-up circuit 130 charges the loop filter 120 through the third and the fourth lines 3 and 4, before generating a stable output signal OUT from the VCO 140. Otherwise, if the detected signals VOP' and VON' are higher than the detecting voltage Vdet, the boost-up circuit 130 does not charge the loop filter 120 just as if the boost-up circuit 130 had not been included in the PLL circuit.

As a result, the filtered and charged signals VOP" and VON" can reach the predetermined common mode voltage as soon as possible, so that the lock-in time of the PLL circuit can be reduced without varying the designed loop characteristics of the PLL circuit.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A phase locked loop circuit for generating an output signal in response to an input signal, comprising:
   a phase detector for detecting a phase error between the input signal and the output signal and outputting a pump up signal and a pump down signal based on the phase error;
   a charge pump coupled to said phase detector for generating a charge pump signal in response to the pump up and the pump down signals;
   a loop filter coupled to said charge pump for filtering out high-frequency components from the charge pump signal to generate a filtered signal, said loop filter having an input terminal and an output terminal;
   boost-up means coupled to the output terminal of said loop filter for charging the input terminal of said loop filter in response to the filtered signal, to expedite the filtered signal reaching a predetermined common mode voltage level; and a voltage-controlled oscillator coupled to the output terminal of said loop filter and said phase detector, for generating the output signal in response to the filtered signal.

2. The phase locked loop circuit according to claim 1, wherein said boost-up means comprises:

bias means for biasing a predetermined detecting voltage;

input means for receiving the filtered signal;

detecting means for detecting whether the filtered signal is less than the detecting voltage; and charging means for charging the input terminal of said loop filter in response to a detection result from said detecting means.

3. The phase locked loop circuit according to claim 1, wherein said charging means charges the input terminal of said loop filter when the detection result indicates that the filtered signal is less than the detecting voltage.

4. A differential phase locked loop circuit for generating an output signal in response to an input signal, comprising:

a phase detector for detecting a phase error between the input signal and the output signal, and outputting a pair of pump up signals and a pair of pump down signals based on the phase error;

a charge pump coupled to said phase detector for generating a pair of charge pump signals in response to the pump up and the pump down signals;

a loop filter coupled to said charge pump for filtering out high frequency components from the charge pump signals to generate a first and a second filtered signal, said loop filter having two input terminals and two output terminals;

boost-up means coupled to the output terminals of said loop filter for charging the input terminals of said loop filter in response to the first and the second filtered signals, to expedite the first and the second filtered signals reaching a predetermined common mode voltage level; and a voltage-controlled oscillator coupled to the output terminals of said loop filter and said phase detector for generating the output signal in response to the first and the second filtered signals.

5. The differential phase locked loop circuit according to claim 4, wherein said boost-up means comprises:

first bias means for biasing a predetermined detecting voltage;

first input means for receiving the first filtered signal;

first detecting means for detecting whether the first filtered signal is less than the detecting voltage;

first charging means for charging said loop filter in response to a detection result from said first detecting means;

second bias means for biasing the detecting voltage;

second input means for receiving the second filtered signal;

second detecting means for detecting whether the second filtered charge signal is less than the detecting voltage; and second charging means for charging said loop filter in response to a detection result from said second detecting means.

6. The phase locked loop circuit according to claim 5, wherein said first bias means comprises:

a first PMOS transistor having a source, a drain, and a gate, the source being coupled to a power supply voltage source, and the drain being coupled to the gate; and a current sinker coupled between the drain of the first PMOS transistor and a ground voltage source.

7. The phase locked loop circuit according to claim 6, wherein said first input means comprises:

a third PMOS transistor having a current path formed between the power supply voltage source and a first node, and a gate coupled to a first line to input the first filtered signal; and an first NMOS transistor having a current path formed between the first node and the ground voltage source, and a gate coupled to the drain of the third PMOS transistor.

8. The phase locked loop circuit according to claim 7, wherein said first detecting means comprises:

a second PMOS transistor having a current path formed between the power supply voltage source and a second node, and a gate coupled to the gate of the first PMOS transistor; and an second NMOS transistor having a current path formed between the second node and the ground voltage source, and a gate coupled to the gate of the first NMOS transistor.

9. The phase locked loop circuit according to claim 8, wherein said second PMOS transistor forms a first current mirror with the first PMOS transistor of said first bias means.

10. The phase locked loop circuit according to claim 8, wherein said second NMOS transistor forms a second current mirror with the first NMOS transistor of the first input means.

11. The phase locked loop circuit according to claim 5, wherein said first charging means comprises a fourth PMOS transistor having a current path formed between a power supply voltage source and a third line, and a gate coupled to a second node.

12. The phase locked loop circuit according to claim 5, wherein said second bias means comprises:

a fifth PMOS transistor having a source, a drain, and a gate, the source being coupled to a power supply voltage source, and the drain being coupled to the gate; and a current sinker coupled between the drain of said fifth PMOS transistor and a ground voltage source.

13. The phase locked loop circuit according to claim 12, wherein said second input means comprises:

a seventh PMOS transistor having a current path formed between the power supply voltage source and a third node, and a gate coupled to a second line to input the second filtered signal;

a third NMOS transistor having a current path formed between the third node and the ground voltage source, and a gate coupled to the drain of the seventh PMOS transistor.

14. The phase locked loop circuit according to claim 13, wherein said second detecting means comprises:

a sixth PMOS transistor having a current path formed between the power supply voltage source and a fourth node, and a gate coupled to the gate of the fifth PMOS transistor; and an fourth NMOS transistor having a current path formed between the fourth node and the ground voltage source, and a gate coupled to the gate of the third NMOS transistor.

15. The phase locked loop circuit according to claim 14, wherein said sixth PMOS transistor forms a third current mirror with the fifth PMOS transistor of the second bias means.

16. The phase locked loop circuit according to claim 14, wherein said fourth NMOS transistor forms a fourth current mirror with the third NMOS transistor of the second input means.

17. The phase locked loop circuit according to claim 5, wherein said second charging means comprises an eighth PMOS transistor having a current path formed between the power supply voltage source and a fourth line, and a gate coupled to a forth node.

* * * * *